United States Patent [19]

Lin

[11] Patent Number: 5,436,203
[45] Date of Patent: Jul. 25, 1995

[54] SHIELDED LIQUID ENCAPSULATED SEMICONDUCTOR DEVICE AND METHOD FOR MAKING THE SAME

[75] Inventor: Paul T. Lin, Austin, Tex.
[73] Assignee: Motorola, Inc., Schaumburg, Ill.
[21] Appl. No.: 270,602
[22] Filed: Jul. 5, 1994
[51] Int. Cl.⁶ .......................................... H01L 21/60
[52] U.S. Cl. .................... 437/209; 437/211; 437/214; 437/219; 437/224
[58] Field of Search ............... 437/209, 211, 212, 213, 437/214, 215, 216, 217, 218, 219, 220, 221, 222, 223, 224; 257/701, 676, 687

[56] References Cited

U.S. PATENT DOCUMENTS

| | | | |
|---|---|---|---|
| 4,218,701 | 8/1980 | Shirasaki | 437/215 |
| 4,264,917 | 4/1981 | Vgon | 437/217 |
| 4,477,828 | 10/1984 | Scherer | 257/687 |
| 4,707,725 | 11/1987 | Ito | 357/72 |
| 4,758,875 | 7/1988 | Fujisaki et al. | 357/72 |
| 4,766,095 | 8/1988 | Hiroshi | 437/217 |
| 4,768,081 | 8/1988 | Moeller | 357/72 |
| 4,788,583 | 11/1988 | Kawahara et al. | 357/72 |
| 4,843,036 | 6/1989 | Schmidt et al. | 437/224 |
| 4,916,522 | 4/1990 | Cohn | 357/72 |
| 4,962,415 | 10/1990 | Yamamoto et al. | 257/701 |
| 5,041,395 | 8/1991 | Steffen | 437/217 |
| 5,087,961 | 2/1992 | Long et al. | 357/69 |
| 5,097,317 | 3/1992 | Fujimoto et al. | 357/72 |
| 5,153,379 | 10/1992 | Guzuk et al. | 174/35 R |
| 5,166,772 | 11/1992 | Soldner et al. | 257/659 |
| 5,206,794 | 4/1993 | Long | 257/675 |
| 5,218,234 | 6/1993 | Thompson et al. | 257/787 |
| 5,258,650 | 11/1993 | Polak et al. | 257/788 |
| 5,311,060 | 5/1994 | Rostoker et al. | 257/676 |

OTHER PUBLICATIONS

Classen, et al; "Integrated Circuit Packages;" United States Statutory Invention Registration, No. H73, Filed Aug. 25, 1993, Appl. No. 526,413 and Published Jun. 3, 1986.

Primary Examiner—Kevin M. Picardat
Attorney, Agent, or Firm—Patricia S. Goddard

[57] ABSTRACT

A semiconductor (30) is shielded from electromagnetic interference by a combination of a reference plane (22) of a circuitized substrate (12) and two different encapsulants. The first encapsulant (38) is an electrically insulative encapsulant which mechanically protects a semiconductor die (32). The first encapsulant is constrained by a dam structure (40) so as not to encapsulate conductive reference pads (18) which are electrically connected to the reference plane by conductive vias (20). A second encapsulant (42) is dispensed over the first encapsulant and is in contact with the reference pads. The second encapsulant is an electrically conductive encapsulant, and is preferably made of a precursor material having the same or similar properties as that of the first encapsulant, but is filled with conductive filler particles to establish electrical conductivity of the encapsulant. Accordingly, the semiconductor die is effectively shielded from both the top and bottom by the electrically conductive encapsulant and the reference plane.

12 Claims, 2 Drawing Sheets

SHIELDED LIQUID ENCAPSULATED SEMICONDUCTOR DEVICE AND METHOD FOR MAKING THE SAME

CROSS-REFERENCE TO RELATED APPLICATION

The present invention relates to a commonly assigned, co-pending patent application by Leo M. Higgins et al. entitled, "Shielded Electronic Component Assembly and Method for Making the Same," Ser. No. 08/229,495, filed Apr. 19, 1994.

FIELD OF THE INVENTION

The present invention relates generally to semiconductor devices and more specifically to semiconductor devices which are shielded from electromagnetic interference (EMI).

BACKGROUND OF THE INVENTION

Along with the increased use of semiconductor devices in portable electronic applications, including high frequency applications such as radios, comes a growing concern for the performance of such devices in environments susceptible to electromagnetic interference (EMI). One of the most typical methods for shielding semiconductor devices from EMI is to include a grounded metal cap or cover surrounding those devices within a system that may be susceptible to EMI interference. While metal caps are certainly effective in shielding EMI, use of such caps have several drawbacks. For instance, the final system layout size may be constrained from further reductions due to the presence of such metal caps. Another drawback is that metal caps can interfere with forced air system cooling. The presence of a metal cap over a semiconductor device prevents air from reaching an internal device which may be dissipating heat within the system. A manufacturing disadvantage associated with using metal caps is that a metal cap is a separate piece part. Preferably the number of piece parts within a manufacturing process is kept to a minimum to avoid unnecessary handling costs and assembly operations. Moreover, the use of a separate metal cap requires an additional processing step of soldering the metal cap to a reference or ground plane.

Accordingly, a need exists for an improvement to the existing use of metal caps or covers over semiconductor devices to shield from EMI. Preferably such an alternative could be implemented at minimal additional manufacturing costs as compared to unshielded devices, without a significant increase in system or device size, and without hindering the thermal management of the system.

SUMMARY OF THE INVENTION

Many of the aforementioned problems are overcome with the present invention. In one form of the invention, a semiconductor device is made by providing a circuitized substrate having a first surface, an internal conductive reference plane, and a conductive member on the first surface which is electrically coupled to the reference plane. A semiconductor die is mounted to the first surface of the substrate, and is electrically connected to the circuitized substrate. A first dam is provided on the first surface of the substrate, and surrounds the semiconductor die to form a first dammed area, such that the conductive member on the first surface of the substrate is beyond the first dammed area. The first dammed area is filled with a first encapsulant which is an electrically insulative liquid encapsulant which encapsulates the die. A second dam is provided on the first surface of the substrate and surrounds the first dammed area to form a second dammed area. The conductive member on the first surface of the substrate is within the second dammed area. The second dammed area is then filled with a second encapsulant which is an electrically conductive liquid encapsulant. The second encapsulant encapsulates the first encapsulant and is an electrical contact with the conductive member. Another form of the invention includes a semiconductor device made by such a process.

DETAILED DESCRIPTION OF THE PREFERRED EMBODIMENT

Figure 1:
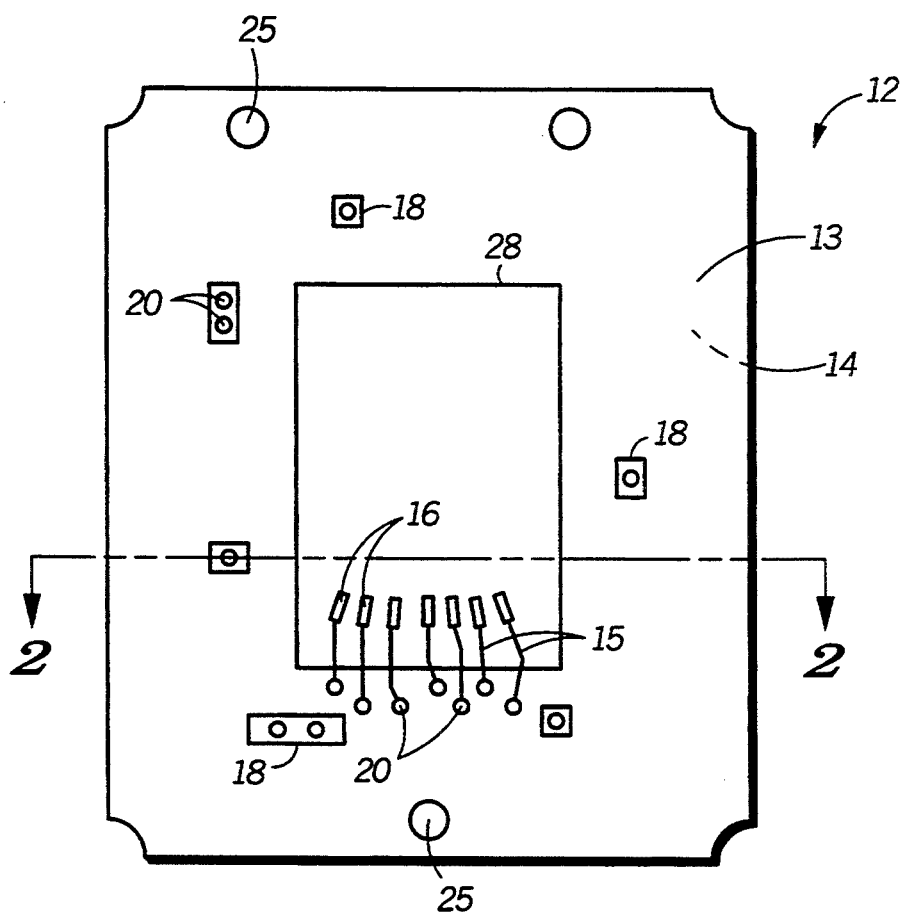
FIG. 1 is a top down view of a circuitized substrate suitable for use in accordance with the present invention.

The present invention establishes an EMI shielded device without use of a separate metal cover or cap, thereby reducing the device profile and mass as compared to prior art shielded devices. In accordance with the invention, a semiconductor die is mounted to a circuitized substrate, such as a printed circuit board. The die is electrically connected to the circuitized substrate in any conventional manner. The die is then covered by dispensing a first liquid encapsulant material over the die. The first liquid encapsulant covering the die is constrained by a first dam formed on the substrate which surrounds the die. This first encapsulant is an electrically insulative encapsulating material, such as an epoxy-based or silicon-based resin used in conventional "glob top" applications. Next, a second liquid encapsulant is dispensed over the first encapsulant. The second encapsulant is an electrically conductive encapsulant, such as an epoxy-based or silicon-based resin having conductive (e.g. metal) filler particles. The second encapsulant covers the first encapsulant and is electrically connected to a conductive member on the circuitized substrate which is electrically connected to a voltage reference plane, such as an internal ground plane of the substrate. Together the voltage reference plane and the conductive second encapsulant effectively sandwich the semiconductor die between grounded elements, thereby effectively shielding the die from EMI both internal and external to the system.

These and other features, and advantages, will be more clearly understood from the following description taken in conjunction with the accompanying drawings. It is important to point out that the illustrations may not necessarily be drawn to scale, and that there may be other embodiments of the present invention which are not specifically illustrated. Throughout the various views, like reference numerals are used to designate identical or corresponding parts.

Figure 2:
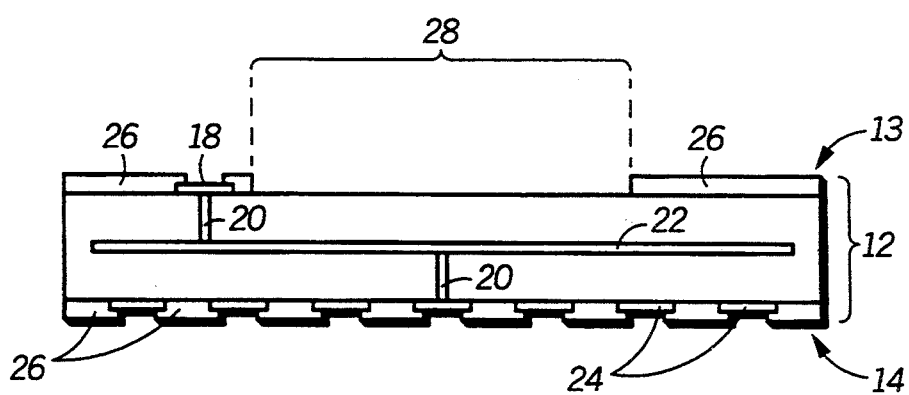
FIG. 2 is a cross-sectional illustration of the substrate of FIG. 1, taken along the line 2—2.

FIG. 1 is a top down view of a circuitized substrate 12 suitable for use in accordance with practicing the present invention. FIG. 2 is a cross-sectional illustration of substrate 12 taken along the line 2—2 of FIG. 1. In order to fully understand the elements of substrate 12, it will be useful to refer to both FIGS. 1 and 2 throughout the description of substrate 12. In preferred embodiments of the present invention, substrate 12 is an epoxy-glass based printed circuit board, made from, for instance, FR4 or bismaleimide-triazine resin. Substrate 12 has a top surface 13 and a bottom surface 14. Formed on each surface are various conductive patterns. For example, top surface 13 includes a plurality of conductive traces 15 and a plurality of bonding posts 16. For the sake of clarity, not all conductive traces or bonding posts are illustrated. Also included on top surface 13 is one or more conductive reference pads 18. The conductive traces 15 and reference pads 18 are routed to either an internal conductive plane or to bottom surface 14 by a plurality of conductive vias 20. More specifically, reference pads 18 are routed to an internal reference plane 22 within substrate 12, while conductive traces 15 are routed to a plurality of conductive pads 24 formed on bottom surface 14. In order to route individual signals or traces from the top surface 13 to the bottom surface 14, it may be necessary to somehow pass through internal reference plane 22. This may be accomplished by forming perforations in reference plane 22, and extending a conductive via through the perforation while maintaining electrical isolation. Those connections to the die which will be tied to the reference plane can be tied directly to the reference plane by a conductive via without the use of perforations. Routing of the various conductive elements vertically through substrate 12 is achieved through the use of conductive vias 20, while routing of conductive members horizontally over surfaces of substrate 12 is accomplished by conductive traces. For example, on the bottom surface 14 of the substrate, a particular conductive via may be routed to a specific conductive pad 24 by a conductive trace (not shown), similar to conductive traces 15 illustrated on top surface 13. Substrate 12 may also include features to aid in manufacturing, such as strip alignment holes 25.

Substrate 12 is manufactured in accordance with conventional processes. For instance, each of the planar conductive elements, such as traces 15, bonding posts 16, reference pads 18, reference plane 22, and conductive pads 24, may be formed by laminating or depositing a metal material (e.g. copper) onto a base insulating substrate material. Subsequent lithographic and etching techniques are then used to define the actual conductive patterns. To achieve a multi-layer substrate, such as that illustrated in FIGS. 1 and 2 which includes at least one internal conductive plane, two or more insulating layers must be laminated together to form the completed substrate. Such techniques are well known in the art. To achieve vertical connections between the individual conductive members, conductive vias may be formed by drilling holes through the insulating material, and subsequently depositing or plating metal into the holes, either along the sidewalls of the holes or throughout the holes such that the holes become filled. Likewise, the formation of conductive vias in multi-layer epoxy-glass substrate materials is well understood within the art.

In accordance with the present invention, substrate 12 also includes a layer of solder resist 26. Solder resist is a layer which is laminated or screen printed onto substrate 12, and serves to mask or shield conductive members on top and bottom surfaces 13 and 14, respectively, from subsequent soldering and/or plating operations. Solder resists materials are commercially available for this purpose. On bottom surface 14, solder resist 26 masks all portions of the surface except portions of conductive pads 24 to which conductive terminals, such as solder balls, are subsequently attached. Thus, any conductive traces which may have been on bottom surface 14 are masked by solder resist 26. With respect to top surface 13, solder resist 26 covers all portions of the surface except a die receiving area 28 and conductive reference pads 18. Any conductive elements within die receiving area 28 thus remain exposed, as do portions of reference pads 18, after application of solder resist 26 to the top surface 13.

Figure 3:
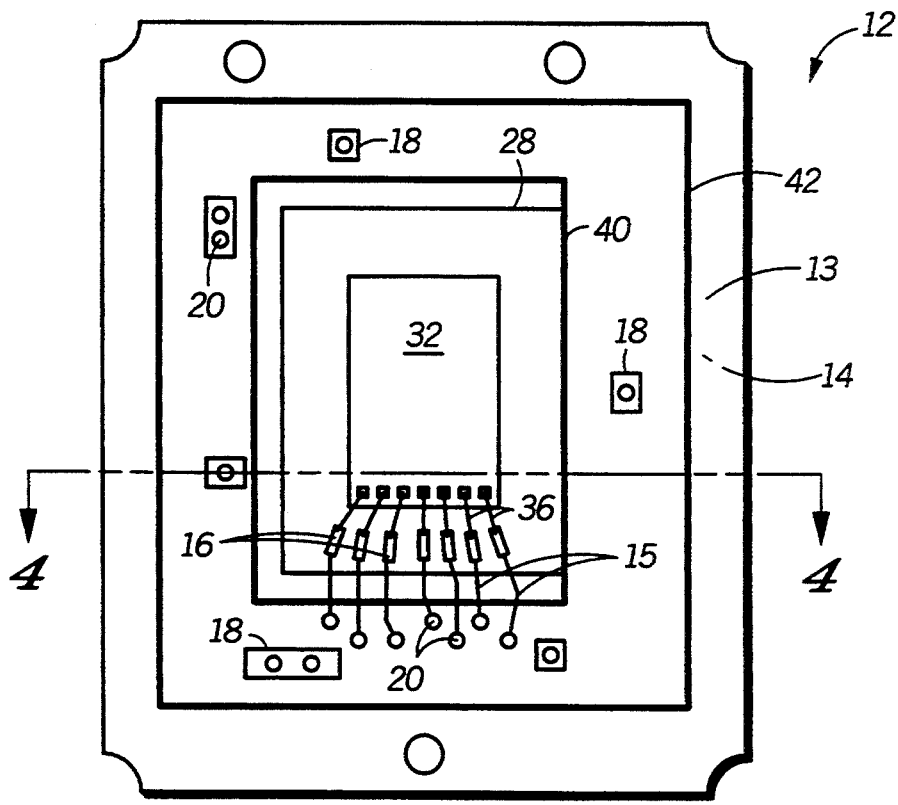
FIG. 3 is a top down view of the substrate of FIG. 1 after a semiconductor die and first and second dams have been formed on the substrate in accordance with the present invention.
Figure 4:
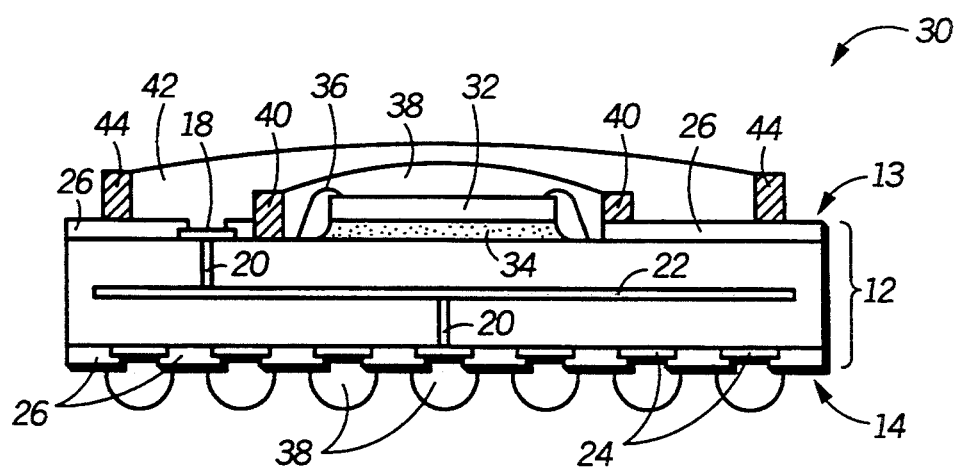
FIG. 4 is a cross-sectional illustration of the substrate, die, and dams of FIG. 3 taken along the line 4—4, after first and second liquid encapsulants have been dispensed in accordance with an embodiment of the present invention.

FIG. 3 is a top down illustration demonstrating how substrate 12 may be used in accordance with the present invention to form a semiconductor device. FIG. 4 is a cross-sectional illustration of a finished ball grid array semiconductor device 30 as it would appear taken along the line 4—4 through substrate 12 illustrated in FIG. 3. In accordance with the present invention, a semiconductor die 32 is mounted to top surface 13 of substrate 12 within die receiving area 28. Semiconductor die 32 may be any type of integrated circuit including, but not limited to, a memory device, a microprocessor, a microcontroller, an analog device, a digital signal processor, or the like. Die 32 is attached to substrate 12 by conventional means, such as by an epoxy die attach material 34. After mounting die 32 to substrate 12, electrical connections between the die and bonding posts or conductive traces are made. As illustrated in FIGS. 3 and 4, electrical connection is achieved through the use of wire bonds 36. However, other means of electrical connection are also available, including TAB (tape automated bonding), or flip chip bonding. The individual electrical connections to the die are routed across and through substrate 12 by way of conductive traces 15 and conductive vias 20. Those connections to the die which must be externally accessible to the device user are routed to conductive pads 24 on the bottom surface 14 as a terminal site. In accordance with one embodiment of the present invention, device 30 is a ball grid array device, wherein the external terminals are in the form of a plurality of conductive solder balls 38. It should be noted that as illustrated in FIG. 3 not all electrically connections between semiconductor die 32 and substrate 12 are illustrated for the sake of clarity. Likewise, FIG. 4 does not illustrate how wire bonds 36 are directly electrically coupled to any conductive pads 24 and solder balls 38; however, such connections are well within the knowledge of one of ordinary skill in the art.

In accordance with the present invention, semiconductor die 32 is encapsulated by a first liquid encapsulant 38. In a preferred embodiment, encapsulant 38 is an epoxy-based or silicon-based resin which is dispensed in a liquid form, such as those resins used in "glob top" encapsulation of semiconductor devices. In dispensing encapsulant 38, and in accordance with the present invention, a dam structure 40 is first formed on substrate 12 around die receiving area 28. Dam structure 40 is used to constrain the flow of liquid encapsulant 38 during dispense. In accordance with the present invention, dam structure 40 is formed around the die receiving area 28, and without encompassing reference pads 18, thus preventing liquid encapsulant 38 from encapsulating the reference pads. The dam structure may either be formed on the solder resist or within the opening in solder resist, both alternatives being illustrated in FIGS. 3 and 4. Dam structure 40 is preferably formed by dispensing a material similar to that of liquid encapsulant 38 using a syringe to define the dam shape. The difference between the materials used to form dam structure 40 and in liquid encapsulant 38 is viscosity of the materials. By making viscosity of the material used to form dam structure 40 higher than that of liquid encapsulant 38, the materials end up having similar properties upon curing, but sufficiently different rheologies so that the dam is sufficiently strong to constrain the flow of encapsulant 38 during its dispense while also maintaining its own shape. Although the materials used for encapsulant 38 and dam 40 are similar, or perhaps the same, the elements are illustrated differently (one being cross-hatched, the other not), only for the sake of clarity. Encapsulant 38 provides environmental protection for semiconductor die 32. This protection includes protection against moisture or contaminant ingress as well as against mechanical damage. So that device 30 may function electrically, encapsulant 38 is an electrically insulating material to prevent electrical short circuiting of the individual wire bond and conductive traces. As with conventional liquid resin encapsulants, encapsulant 38 may also include filler particles, such as silica, silicon dioxide, silicon nitride, or the like, which serve to control flow characteristics and thermal expansion properties of the material.

After encapsulating semiconductor die 32 with encapsulant 38, an additional encapsulation operation is performed in accordance with the present invention. As illustrated in FIG. 4, a second encapsulant 42 is dispensed over the first encapsulant 38. Encapsulant 42 is likewise a liquid encapsulating material, and is constrained by a second dam structure 44. Dam structure 44 encircles dam structure 40 and encompasses conductive reference pads 18. Thus, upon dispensing encapsulant 42, encapsulant 42 encapsulates first encapsulant 38 and is in contact with reference pads 18 which are exposed by solder resist 26 on top surface 13 of the substrate. In accordance with the present invention, encapsulant 42 is an epoxy-based or silicon-based resin having conductive filler particles dispersed throughout. The purpose of having conductive filler particles is to establish electrical conductivity of encapsulant 42, thereby enabling encapsulant 42 to be electrically tied to internal reference plane 22 by reference pads 18 and conductive vias 20. Otherwise, the precursor material used for encapsulant 42 is the same or very similar to the material used for encapsulant 38 because it is desirable to have the physical properties of the two materials as similar as possible to avoid interface discontinuities. For example, the same resin precursor may be used in both first encapsulant 38 and second encapsulant 42; the only difference being the type and amount of filler particles used in the two encapsulants. Thus, upon curing the resins of the two encapsulants merge so that a distinct interface does not exist. Suitable filler particles in encapsulant 42 to establish electrical conductivity include metal particles or conductively coated polymer particles of sufficient concentration to establish electrical conductivity throughout the encapsulant. Fillers made from silver, copper, palladium, and gold are all suitable for practicing the invention.

Like dam structure 40, dam structure 44 is preferably an epoxy-based or silicon-based resin of sufficient viscosity to maintain the dam structure and constrain the flow of encapsulant 42. Upon curing, the dam structure preferably becomes as similar to encapsulant 42 as possible; however, dam structure 44 need not be (but may be) electrically conductive. Curing encapsulant 42 may be performed after first encapsulant 38 has been cured, but preferably to avoid unnecessary process steps all encapsulant materials are cured at the same time.

Device 30 has many advantages over prior art shielded devices. As is evident from the illustration of FIG. 4, semiconductor die 32 is effectively shielded from both the top and bottom by the combination of electrically conductive encapsulant 42 and internal reference plane 22. In device operation, internal reference plane 22 will be tied to a constant voltage potential, such as ground potential, thereby establishing a shield surrounding semiconductor die 32 which protects against either external or internal EMI. Moreover, device 30 does not have many of the disadvantages associated with using a separate metal cap to provide the EMI shielding. Specifically, device 30 does not require handling or use of a separate piece part which reduces device, handling, and general manufacturing costs. Instead, a liquid encapsulant is used to provide the shielding. While application of encapsulant 42 is an additional manufacturing step, it is easily incorporated into the manufacturing process since liquid encapsulant 38 is already included for necessary mechanical protection. Likewise, the formation of dam structures 40 and 44 is integrated into the encapsulation operation. Dam structures 40 and 44 and encapsulant 38 and encapsulant 42 may be formed on substrate 12 within the same processing step (encapsulation), although formed in a sequential fashion. There is no need to have intermediate curing cycles between the dispense of encapsulant 38 and the dispense of encapsulant 42, provided the set time of encapsulant 38 is sufficiently short so that encapsulant 42 may be dispensed on encapsulant 38, prior to cure, without excessive mixing of the materials. Another advantage of the present invention over the use of metal caps for shielding is the elimination of any air gaps between the encapsulation of the semiconductor die and the shield. In using a metal cap, there is inherently an air gap in-between the encapsulation material and the metal shield. This air gap hinders thermal dissipation from the device, as well as hinders any forced air cooling which may be present within the system. A device in accordance with the present invention, however, has no such air gap. Rather encapsulant 42 is an intimate contact with encapsulant 38, and upon curing the two materials may merge to the extent that there is not an abrupt interface which may impede thermal dissipation. An additional thermal advantage of a device formed in accordance with the present invention is that there is an inherent thermal path away from semiconductor die 32. This path is from die 32 to encapsulant 42 and down to internal reference plane 22, which because of the large surface area will serve as a good source of thermal dissipation. A further advantage of the present invention is that the use of a liquid encapsulant to serve as the EMI shield keeps the overall device profile very small. Moreover, encapsulant 42 may also serve as an alpha particle protection layer for memory devices as well as an EMI shield. For instance, the thickness, density, and types of filler particles used in encapsulant 42 may be chosen to protect against a particular range of impinging alpha particle energies. The fillers chosen for alpha particle protection may be conductive, thereby also allowing encapsulant 42 to serve as an EMI shield. Alternatively, electrically insulative filler particles for alpha particle protection may be combined with conductive fillers in the outermost encapsulant. Another advantageous aspect of the present invention is that the use of an additional encapsulant 42 may be used to compensate for stresses between substrate 12 and first encapsulant 38. In prior art device thermal expansion coefficient mismatch between encapsulating materials and substrate materials can lead to warpage of the substrate. By using a second encapsulating material, the second encapsulate can be formulated to compensate or offset these differentials. For example, if first encapsulant 38 is a tensile encapsulate, the second encapsulant 42 may be made to be compressive, or vice versa. Such compensation is preferably accomplished through choice of filler materials and amount of filler used in each encapsulant, rather than by modifications to the precursor resin components of the encapsulants. The base resins preferably remain similar so that a distinct interface between the two encapsulants is substantially avoided upon curing.

Thus, it is apparent that there has been provided a shield liquid encapsulant semiconductor device and method for making the same that meets the advantages and needs previously set forth. Although the invention has been described and illustrated with reference to specific embodiments thereof, it is not intended that the invention be limited to these illustrative embodiments. Those skilled in the art will recognize that modifications and variations can be made without departing from the spirit of the invention. For example, a device in accordance with the present invention is not limited to applications employing a single semiconductor chip. Multi-chip modules are also within the scope of the invention. In addition, the invention is not limited to those specific epoxy-glass substrate materials mentioned. Nor is the invention limited to having the dam structures formed of the same material or similar material to the encapsulant materials. Other dam materials known in the art capable of performing the same function are within the scope of the invention. Also, it is not necessary that solder resist be absent from the die receiving area of the substrate. The presence of solder resist within the die receiving area (i.e. beneath the semiconductor die) is possible provided that appropriate electrical connections can be made to the conductive elements of the substrate. Moreover, fillers used in the outer most encapsulant may be chosen to protect against impinging alpha particles, whether conductive or not. Also, carbon black powder can be added to encapsulant to enhance thermal conductivity and to modify the color and contrast of the encapsulant for marking and cosmetic purposes. Therefore, it is intended that this invention encompass all such variations and modifications as fall within the scope of the appended claims.

I claim:

1. A method for making a semiconductor device comprising:
   providing a circuitized substrate having a first surface, an internal conductive reference plane, and a conductive member on the first surface which is electrically coupled to the reference plane;
   providing a semiconductor die;
   mounting the semiconductor die to the first surface of the substrate;
   providing electrical connections between the semiconductor die and the circuitized substrate;
   providing a first dam on the first surface of the substrate for surrounding the semiconductor die and establishing a first dammed area, wherein the conductive member is beyond the first dammed area;
   filling the first dammed area with a first encapsulant, which is an electrically insulative liquid encapsulant, such that the die is encapsulated;
   providing a second dam on the first surface of the substrate for surrounding the first dammed area and establishing a second dammed area, wherein the conductive member is within the second dammed area; and
   filling the second dammed area with a second encapsulant, which is an electrically conductive liquid encapsulant, such that the second encapsulant encapsulates the first encapsulant and is in electrical contact with the conductive member.

2. The method of claim 1 wherein the step of providing a circuitized substrate comprises providing a circuitized substrate having a solder resist layer formed on the first surface of the substrate and patterned to expose the conductive member.

3. The method of claim 2 wherein the step of providing a circuitized substrate comprises providing a circuitized substrate wherein the solder resist layer is absent from a majority of the first dammed area.

4. The method of claim 1 wherein the step of filling the second dammed area comprises filling the second dammed area with a resin filled with conductive particles.

5. The method of claim 4 wherein the step of filling the first dammed area comprises filling the first dammed area with a first encapsulant comprising the resin.

6. A method for making a semiconductor device comprising the steps of:
   providing a printed circuit board substrate having a mounting surface, a substantially continuous internal reference plane, a plurality of conductive traces formed on the mounting surface, and a dedicated reference pad on the mounting surface which is electrically connected to the reference plane;
   providing a semiconductor die;
   attaching the semiconductor die to the mounting surface;
   electrically connecting the semiconductor die to the plurality of conductive traces;
   forming a first dam on the mounting surface to create a first dammed area;
   filling the first dammed area with an electrically insulative liquid encapsulant such that the semiconductor die is encapsulated and without encapsulating the dedicated reference pad;
   forming a second dam on the mounting surface to create a second dammed area for surrounding the first dammed area; and
   filling the second dammed area with an electrically conductive liquid encapsulant such that the electrically insulative liquid encapsulant is encapsulated and such that the dedicated reference pad is in contact with the electrically conductive liquid encapsulant.

7. The method of claim 6 wherein the step of electrically connecting comprises wire bonding the semiconductor die to the plurality of conductive traces.

8. The method of claim 6 wherein the step of filling the second dammed area comprises filling the second dammed area with a resin filled with conductive particles.

9. The method of claim 8 wherein the step of filling the first dammed area comprises filling the first dammed area with a first encapsulant having a first resin precursor material, wherein the step of filling the second dammed area comprises filling the second dammed area with a second encapsulant having a second resin precursor material, and wherein the first and second precursor materials have a same base resin.

10. The method of claim 9 wherein the step of filling the first dammed area comprises filling the first dammed area with a first encapsulant having a first resin precursor material, wherein the step of filling the second dammed area comprises filling the second dammed area with a second encapsulant having a second resin precursor material, and wherein the first and second resin precursor materials are selected from a group consisting of epoxy-based resins and silicon-based resins.

11. The method of claim 6 wherein the step of providing a printed circuit board substrate comprises providing a substrate comprised of bismaleimide-triazine resin.

12. The method of claim 11 wherein the step of providing a printed circuit board substrate comprises providing a substrate having a surface opposite the mounting surface, and further comprising the step of attaching a plurality of conductive balls to the surface opposite the mounting surface which are electrically coupled to the semiconductor die through the substrate.

* * * * *